US006567434B2

(12) United States Patent
Spinelli et al.

(10) Patent No.: US 6,567,434 B2
(45) Date of Patent: May 20, 2003

(54) CW FAR-UV LASER SYSTEM WITH TWO ACTIVE RESONATORS

(75) Inventors: Luis A. Spinelli, Sunnyvale, CA (US); Briggs Atherton, Santa Clara, CA (US)

(73) Assignee: Coherent, Inc., Santa Clara, CA (US)

(*) Notice: Subject to any disclaimer, the term of this patent is extended or adjusted under 35 U.S.C. 154(b) by 0 days.

(21) Appl. No.: 10/215,742

(22) Filed: Aug. 9, 2002

(65) Prior Publication Data

US 2002/0196819 A1 Dec. 26, 2002

Related U.S. Application Data

(63) Continuation of application No. 09/475,767, filed on Dec. 30, 1999, which is a continuation-in-part of application No. 09/292,540, filed on Apr. 15, 1999, now Pat. No. 6,198,756.

(51) Int. Cl.[7] .................................................. H01S 3/10
(52) U.S. Cl. .......................................... 372/22; 372/92
(58) Field of Search ............................. 372/22, 92, 21, 372/94

(56) References Cited

U.S. PATENT DOCUMENTS

| 4,914,658 | A | * | 4/1990 | Stankov et al. ............... 372/21 |
| 5,050,179 | A | | 9/1991 | Mooradian .................... 372/44 |
| 5,131,002 | A | | 7/1992 | Mooradian .................... 372/50 |
| 5,289,485 | A | | 2/1994 | Mooradian .................... 372/45 |
| 5,408,481 | A | * | 4/1995 | SAcheps ....................... 372/22 |
| 5,412,674 | A | * | 5/1995 | Scheps ......................... 372/22 |
| 5,461,637 | A | | 10/1995 | Mooradian et al. ........... 372/92 |
| 5,627,853 | A | | 5/1997 | Mooradian et al. ........... 372/92 |
| 5,651,019 | A | | 7/1997 | Goldberg et al. ............. 372/68 |
| 5,809,048 | A | * | 9/1998 | Shichijyo et al. ............. 372/32 |
| 5,912,910 | A | * | 6/1999 | Sanders et al. ............... 372/22 |
| 5,991,318 | A | | 11/1999 | Caprara et al. ............... 372/22 |
| 6,198,756 | B1 | * | 3/2001 | Caprara et al. ............... 372/22 |
| 6,301,273 | B1 | * | 10/2001 | Sandeers et al. ............. 372/22 |
| 6,304,585 | B1 | * | 10/2001 | Sanders et al. .............. 372/22 |

FOREIGN PATENT DOCUMENTS

| EP | 0 608 866 | 8/1994 | ............ H01S/3/108 |
| WO | WO 00/64017 | 10/2000 | ............ H01S/3/108 |

OTHER PUBLICATIONS

A.H. Paxton et al., "Design of external cavities for vertical–cavity semiconductor lasers," *Proceedings of the SPIE—The International Society for Optical Engineering*, 1993, vol. 1868, pp. 235–243.

J.V. Sandusky et al., "A CW External–Cavity Surface–Emitting Laser," *IEEE Photonics Technology Letters*, vol. 8, No. 3, Mar. 1996, pp. 313–315.

(List continued on next page.)

*Primary Examiner*—Leon Scott, Jr.
(74) *Attorney, Agent, or Firm*—Stallman & Pollock LLP

(57) ABSTRACT

A laser system includes a travelling-wave active laser-resonator arranged for generating laser-radiation having a first wavelength and arranged such that the first-wavelength radiation circulates in only one direction therein. An optically-nonlinear element is positioned in the travelling-wave laser-resonator such that the first-wavelength radiation circulates therethrough. Radiation having a second-wavelength is injected into the optically-nonlinear crystal such that the first-wavelength radiation and second-wavelength radiation mix therein, thereby generating radiation having the sum-frequency of the first and second-wavelength radiations. The sum-frequency radiation from the optically-nonlinear element is delivered from the laser system as output-radiation. In one example, the travelling-wave resonator has a YVO4 gain medium generating radiation having a wavelength of about 1064 nm. The optically-nonlinear crystal is a CLBO crystal. 244 nm radiation from an intracavity frequency doubled argon laser is injected into the optically-nonlinear crystal providing output radiation having a wavelength of about 195 nm.

16 Claims, 13 Drawing Sheets

OTHER PUBLICATIONS

M. Kuznetsov et al., "High–Power (>0.50–W CW) Diode–Pumped Vertical–External–Cavity Surface–Emitting Semiconductor Lasers with Circular $TEM_{00}$ Beams," *IEEE Photonics Technology Letters*, vol. 9, No. 8, Aug. 1997, pp. 1063–1065.

A. Rosiewicz et al., "Optical pumping improves VCSEL performance," *Laser Focus World*, Jun. 1997, pp. 133–136.

W.J. Alford et al., "Intracavity frequency doubling of an optically–pumped, external–cavity surface–emitting semiconductor laser," *Advanced Solid State Laser Conference*, Sandia National Laboratories, SAND–98–2108C, CONF–990105, Dec. 31, 1998, 5 pages in length.

G.C. Bhar et al., "Widely tunable deep ultraviolet generation in CLBO," *Optics Communications*, vol. 176, Mar. 15, 2000, pp. 199–205.

W.P. Risk et al., "Diode laser pumped blue–light source based on intracavity sum frequency generation," *Applied Physics Letters*, vol. 54, No. 9, Feb. 27, 1989, pp. 789–791.

P.N. Kean et al., "Generation of 20 mW of blue laser radiation from a diode–pumped sum–frequency laser," *Appl. Phys. Lett.*, vol. 63, No. 3, Jul. 19, 1993, pp. 302–304.

K. Koch et al., "Raman Oscillation with Intracavity Sum-–Frequency Generation," *IEEE Journal of Quantum Electronics*, vol. 35, No. 1, Jan. 1999, pp. 72–78.

Y.K. Yap et al., "High–power fourth– and fifth–harmonic generation of a Nd:YAG laser by means of a $CsLiB_6O_{10}$," *Optics Letters*, vol. 21, No. 17, Sep. 1, 1996, pp. 1348–1350.

* cited by examiner

US 6,567,434 B2

CW FAR-UV LASER SYSTEM WITH TWO ACTIVE RESONATORS

This application is a continuation of application Ser. No. 09/475,767, filed Dec. 30, 1999.

This application is a continuation-in-part of application Ser. No. 09/292,540, filed Apr. 15, 1999 now U.S. Pat. No. 6,198,756.

TECHNICAL FIELD OF THE INVENTION

The present invention relates in general to ultraviolet (UV) lasers. It relates, in particular, to a laser in which radiation at a wavelength between about 200 and 280 nanometers (nm), generated by a first active laser-resonator, is mixed, in an optically-nonlinear crystal located in a second active laser-resonator, with radiation generated by the second laser resonator and having a wavelength between about 900 and 1080 nm, thereby generating radiation having a third wavelength corresponding to the sum-frequency of the first and second wavelengths and having a wavelength between about 175 and 215 nm.

DISCUSSION OF BACKGROUND ART

Optical systems are used in optical lithography for patterning or "writing" on photoresist for lithographic masking operations. The resolution of these optical systems is inversely related to the wavelength used for the patterning or writing. In so-called direct-writing systems, where photoresist coated wafers are directly patterned by an optically-steered, focussed, beam of radiation rather than being exposed through a mask. The, the quality of the beam is as important as the wavelength of the beam for obtaining highest possible resolution, and, accordingly smallest possible feature size. Smaller features, of course, lead to higher component packing densities. One particularly useful light source for direct writing operations is an intracavity frequency-doubled argon ion-laser, having an output wavelength of 244 nm. Such a laser is used in a direct writing system manufactured by Etec, Inc., of Hayward, Calif.

Because of a continuing demand for ever smaller and faster semiconductor devices, there is a similar need for a laser system having a shorter wavelength than the 244 nm of existing direct-writing systems. Such a laser system, of course, should have a beam-quality comparable to existing 244 nm laser systems and provide sufficient power such that exposure times are not unacceptably protracted.

SUMMARY OF THE INVENTION

In one aspect of the present invention, a laser system comprises first and second active laser-resonators. The first laser-resonator delivers laser-radiation at a first wavelength, and the second laser-resonator is arranged to generate laser-radiation therein at a second wavelength.

The second laser-resonator includes an optically-nonlinear crystal. The first and second laser-resonators and the optically-nonlinear crystal are cooperatively arranged such that first-wavelength radiation delivered by the first laser-resonator is mixed in the optically-nonlinear crystal with the second-wavelength radiation generated in the second laser-resonator, thereby generating radiation having a third-wavelength corresponding to the sum frequency of the first and second wavelengths.

In another aspect of the present invention, radiation having a wavelength between about 200 and 280 nanometers (nm), generated by a first active laser-resonator, is mixed, in an optically-nonlinear crystal located in a second active laser-resonator, with radiation generated by a second laser resonator and having wavelength between about 900 and 1080 nm, thereby generating radiation having a third wavelength corresponding to the sum-frequency of the first and second wavelengths and having a wavelength between about 175 and 215 nm.

In one embodiment of a laser system in accordance with the present invention, 1 Watt (W) of 244 nm radiation is delivered by a prior-art, intracavity frequency-doubled argon-ion laser. Fundamental radiation having a wavelength of about 976 nm is generated in an external-cavity surface-emitting semiconductor laser-resonator (OPS laser-resonator). The 244 nm radiation is mixed in a cesium lithium borate (CLBO) optically-nonlinear crystal with about 500 W of 976 nm radiation circulating in the OPS laser-resonator to provide about 100 milliwatts (mW) of radiation having a wavelength of about 195 nm.

Dispersion characteristics of CLBO allow that the 244 nm radiation can be directed into the CLBO optically-nonlinear crystal without passing through any optical components of the second resonator, thereby avoiding potential absorption losses in those components. Similarly, the 195 nm radiation generated by the sum-frequency mixing, and residual 244 nm radiation, leave the second resonator without passing through any optical components thereof.

In another embodiment of the inventive laser system, the optically-nonlinear crystal in the active, second laser-resonator is commonly located in a passive, travelling-wave ring-resonator ring-resonator arranged to recirculate and build up the 244 nm radiation passing through the CLBO crystal, thereby increasing the output power of 195 nm radiation to about 800 mW.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
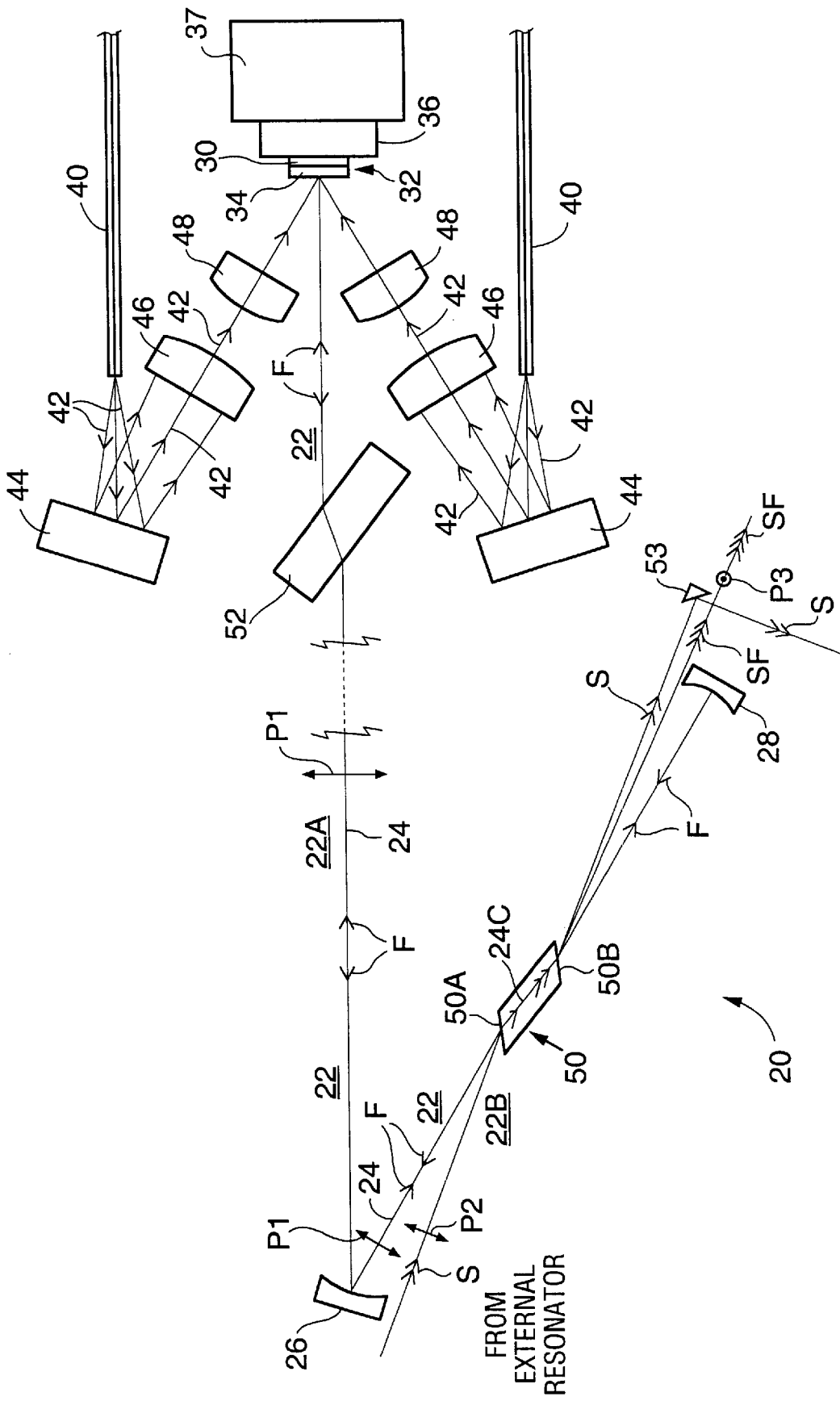
FIG. 1 schematically illustrates a preferred embodiment of a UV-laser system in accordance with the present invention having a first laser-resonator including an OPS-structure and an optically-nonlinear crystal arranged for intracavity frequency-mixing a fundamental-wavelength of the OPS-structure with UV-radiation injected into the first laser-resonator from a second laser-resonator, and wherein the first laser resonator is a standing-wave resonator.

Turning now to the drawings, wherein like features are designated by like reference numerals. FIG. 1 schematically illustrates one preferred embodiment of laser-system 20 in accordance with the present invention. This system, as illustrated in FIG. 1, is configured for sum-frequency mixing 244 nm radiation with 976 nm radiation to provide 195 nm radiation.

Laser 20 includes a resonator 22 having a longitudinal axis 24 thereof folded by a fold-mirror 26. Resonator 22 is terminated at one end thereof by a mirror 28, and at the other end thereof by a mirror portion (mirror-structure) 30 of an optically-pumped surface-emitting semiconductor laser structure (OPS-structure) 32. A gain portion (gain-structure) 34 of OPS-structure 32 is thus located in the resonator in contact with a resonator mirror, i.e., mirror-structure 30. Resonator 22 may be considered as being folded into two arms 22A and 22B by fold mirror 26. In this preferred embodiment, arm 22A is about twice as long as arm 22B and is shown foreshortened in FIG. 1 for convenience of illustration.

Gain-structure 34 of OPS-structure 32 is an epitaxially-grown monolithic semiconductor multilayer structure including a plurality of active layers (not shown in FIG. 1) spaced apart by pump-light-absorbing separator-layers (also not shown in FIG. 1). It should be noted here that the terminology "spaced apart by pump-light-absorbing separator layers" in the context of this description and the appended claims does not preclude there being other layers between the QW layers. Depending on the composition of the QW layers, one or more other layers may be included for strain-management, carrier-confinement and the like. Any such arrangement is applicable in the context of the present invention. In this preferred embodiment, QW layers have a composition selected to provide fundamental radiation at a wavelength of about 976 nm.

Continuing now with reference to FIG. 1, OPS-structure 32 is bonded in thermal contact with a heat-sink 36. Heat-sink 36 is preferably an actively-cooled heat-sink such as a microchannel-cooler. OPS-structure 32 is optically pumped, preferably, by pump-light delivered from one or more diode-laser arrays (not shown). In FIG. 1, pump-light is delivered from two diode-laser arrays via two optical fibers (or fiber bundles) 40. Pump-light 42 diverges as it exits a fiber 40. In each case, the diverging pump-light is directed by a mirror 44, through focusing lenses 46 and 48, to be focused (only an axial ray shown) on gain-structure 34 of OPS-structure 32. It should be noted, that while two pump-light-delivery fibers 40 and associated focussing optics are illustrated in FIG. 1, this should not be considered as limiting the present invention. Only one, or more than two pump-light-delivery fibers and associated focusing-optics may be used, and even different pump-light sources with or without fiber delivery may be used, without departing from the spirit and scope of the present invention. Further, it should be noted that optical fibers and fiber bundles are just one preferred means of transporting pump-light from a source thereof. Other forms of what may be generally termed "a lightguide", for example, solid or hollow light-waveguides maybe used without departing from the spirit and scope of the present invention.

Mirrors 26 and 28, and mirror-structure 30 of OPS-structure 32, each have maximum reflectivity at a fundamental (emission) wavelength characteristic of the composition of (active layers of) gain-structure 34 of OPS-structure 32, here 976 nm. Details of one preferred OPS structure for providing this fundamental wavelength are discussed further hereinbelow. Energizing gain-structure 34 of OPS-structure 32 causes laser-radiation having the fundamental-wavelength (fundamental-radiation) to circulate in resonator 22. This fundamental-radiation is indicated in FIG. 1 by single arrows F.

Included in resonator 22, in folded portion 22B thereof, proximate, but spaced apart from mirror 28, is an optically-nonlinear crystal 50 arranged for sum frequency mixing fundamental radiation F with UV-radiation (designated by double arrows S) injected into optically-nonlinear crystal 50 from an external active laser-resonator (not shown in FIG. 1). Mixing UV-radiation S with fundamental radiation F generates, by UV-radiation (designated by triple arrows SF) having a shorter wavelength than UV radiation S, i.e., having the sum-frequency of radiations F and S1.

A preferred material for optically-nonlinear crystal 50 is cesium lithium borate (CLBO). CLBO has advantageous properties for a laser system in accordance with the present invention, which, inter alia, allow that the crystal can be cut and configured such that (as shown in FIG. 1), radiation S can enter entrance-face 50A of optically-nonlinear crystal 50 at an angle of about 5° to fundamental radiation F (axis 24) and traverse the crystal about along a common path 24C. This is due to the difference in refractive index of the CLBO for the S and F wavelengths. On leaving exit face 50B of optically-nonlinear crystal 50, residual radiation S diverges at the same angle from axis 24, again due to the refractive index difference. Radiation SF diverges from radiation S by an angle of about 1°, due to a refractive index difference of the CLBO for the SF and the S radiations. This divergence allows radiation S to enter and leave resonator 22, and radiation SF to leave resonator 22, without passing through any optical components of resonator 22. This simplifies the design and manufacture of coatings for mirrors 26 and 28, as well as avoiding power loss which could be experienced in radiations S and SF had they to traverse optical coatings designed to efficiently reflect fundamental radiation F. In this arrangement, the divergence of radiations S and SF is sufficient that a reflective stop 53, or the like, may be deployed outside of resonator 22 to separate the S and SF radiations. Further details of an appropriately configured CLBO crystal are presented further hereinbelow.

While the arrangement of laser system 20 of FIG. 1 is a preferred arrangement for introducing radiation S into optically-nonlinear crystal 50, those skilled in the art to which the present invention pertains will recognize that other arrangements wherein radiation S traverses one or more mirrors of the fundamental resonator may be devised without departing from the spirit and scope of the present invention. Similarly while CLBO is considered to be particularly advantageous in a laser system in accordance with the present invention the use of any other optically nonlinear crystal is not precluded. By way of example, optically nonlinear materials including strontium barium borate (SBBO), strontium borate (SBO), and barium zinc borate (BZBO) are believed to be effective for generating UV radiation at wavelengths as short as 175 nm or even shorter. Beta barium borate (BBO) may also be used, however, some reduction in performance is to be expected.

The folded-resonator arrangement of resonator 22 is designed, inter alia, to allow formation of a resonating beam in resonator 22 having optimum characteristics at OPS-structure 32 for maximum fundamental power generation in a single axial-mode, while having optimal characteristics at optically-nonlinear crystal 50 for optimum sum-frequency mixing. In one arrangement, the pump-light spot-size at OPS-structure 32 preferably has a gaussian shape, preferably with a $1/e^2$ radius of about 220 micrometers ($\mu$m). In order to maximize overlap and obtain optimum power-extraction in fundamental transverse mode, the resonating fundamental-radiation at OPS-structure 32 preferably has a similar size of 220 $\mu$m ($1/e^2$ radius). A preferred spot-size of fundamental-radiation in optically-nonlinear crystal 50 is preferably of the order of 50 $\mu$m ($1/e^2$ radius) for optimum sum-frequency mixing.

In an intracavity sum-frequency generating laser-system in accordance with the present invention, it is preferable to include a wavelength-selective element, such as a birefringent filter or an etalon in resonator 22 for forcing the resonator to oscillate precisely at the fundamental wavelength. In laser 20, such a wavelength-selective element is depicted in the form of a birefringent filter 52 arranged at Brewster's angle (here 57.1°) to axis 24 of resonator 20. It is emphasized here that the purpose of this wavelength-selective element is not axial-mode selection, as this is accomplished by a combination of the unique properties of OPS-structure 32 combined with its location in resonator 22. Rather, birefringent filter 52 is used to effectively spectrally narrow the gain-bandwidth of gain-structure 34 of OPS-structure 32 to a bandwidth narrower than a spectral acceptance region over which the optically-nonlinear crystal 50 is effective. This prevents laser 20 from oscillating at wavelengths where the optically-nonlinear crystal is ineffective.

In one example of a laser 20 in accordance with the arrangement of FIG. 1, OPS-structure 32 (see FIG. 2) has a gain-structure 34 comprising fifteen QW or active-layers of an $In_{0.18}Ga_{0.82}As$ composition, having a thickness of about 75.0 Angstrom Units (Å) providing a nominal fundamental (emission) wavelength of 976 nm. Between the QW layers are pump-light-absorbing (separator) layers of a $GaAs_{0.978}P_{0.022}$ composition having a thickness of 1217 Å. Between the QW layers and the separator layers is a strain-relieving layer of GaAs having a thickness of about 50 Å. Mirror-structure 30 comprises 27 pairs or periods of alternating layers of GaAs having a refractive index of about 3.51 and $AlAs_{0.96}P_{0.04}$ having a refractive index of about 2.94 and an optical thickness of one-quarter wavelength at the fundamental-wavelength. Gain-structure 34 also includes a carrier-confinement layer of $Ga_{0.51}In_{0.49}P$ having a thickness of 1588 Å, between the last separator layer and mirror-structure 30. At an opposite extremity of gain-structure 34 there is also a carrier-confinement layer of $Ga_{0.51}In_{0.49}P$ having a thickness of 1588 Å.

OPS-structure 32 is epitaxially grown on an n-type GaAs wafer (substrate), gain-structure 34 being grown first, beginning with the carrier confinement layer. Mirror-structure 30 is epitaxially-grown on the gain-structure. After the OPS-structure is grown, the wafer is etched away. The first-grown confinement layer serves as an etch-stop layer when the substrate is removed by etching. The wafer, and structures grown thereon, is diced into several OPS-structures 32 in the form of square "chips" about 2.0 mm by 2.0 mm.

An OPS-structure (chip) is first bonded to a microchannel-cooler (cooler 36). One preferred microchannel-cooler is a Model SA-2, available from Saddleback Aerospace Corporation of Los Alamitos, Calif. Before bonding the OPS-structure to the microchannel-cooler, a relatively thin (about 0.3 mm thick) synthetic diamond layer, preferably a single crystal diamond layer, is bonded to the microchannel-cooler. One preferred bonding method in accordance with the present invention is to provide metalization on the diamond comprising a titanium layer overcoated by an (outermost) platinum layer. Bonding is then performed using indium solder.

After the OPS-structure is bonded to the diamond-layer/microchannel-cooler, the GaAs substrate is removed by etching. Preferably, an antireflection coating is deposited on thus-exposed gain-structure 34 to improve entry of pump-light into the gain-structure.

Regarding optical pumping of OPS-structure 32, each fiber 40 delivers 795 nm radiation from diode array package, for example, a FAP-30C-800-B diode-laser-array package available from Coherent Semiconductor Group of Santa Clara, Calif. Mirrors 44 are dielectric-coated mirrors having greater than 99.9% reflectivity at 795 nm and 28° angle of incidence. Lenses 46 are cemented doublets having a focal length of 40.0 mm and a diameter of 18.0 mm. Lenses 48 are cemented doublets having a focal length of 21.0 mm and a diameter of 14 mm. These lenses are available from Melles Griot of Irvine, Calif. The pump-light is focused by the mirrors and lenses into an area of OPS-structure. A total of 34 Watts of pump-light in the pumped area has a substantially Gaussian intensity profile with a radius of about 260 $\mu$m at the 1/e2 points. The exemplified diode-laser-array packages providing the pump-light require about 50.0 Watts each of electrical-power input generate 20.0 Watts of pump radiation coupled into transport fibers 40.

Birefringent filter 52 is quartz plate having a thickness of 3.08 mm and oriented as depicted in FIG. 1 at 57.1 degrees to axis 24, with the quartz optical axis in the plane of the plate. Such a filter is available as Part No. BF254-6T from VLOC Company of Port Richey, Fla. This orientation of birefringent filter 52 provides that fundamental radiation F is polarized parallel to the plane of FIG. 1 as illustrated by arrow P1.

Birefringent filter 52 has narrow transmission-peaks separated by about 35 nm, each with a full width at half maximum transmission (FWHM) of about 3 nm. Maximum selectivity is achieved by keeping the quartz optic-axis at an angle of about 45 degrees from an axis defined by the intersection of the vertical plane with the plane of the plate. The wavelength of the transmission peaks can be shifted by rotating the plate slightly around an axis normal to its faces, thus achieving tuning of the filter. The computed tuning rate, confirmed experimentally, is about 5.6 nm per degree of rotation.

Figure 3:
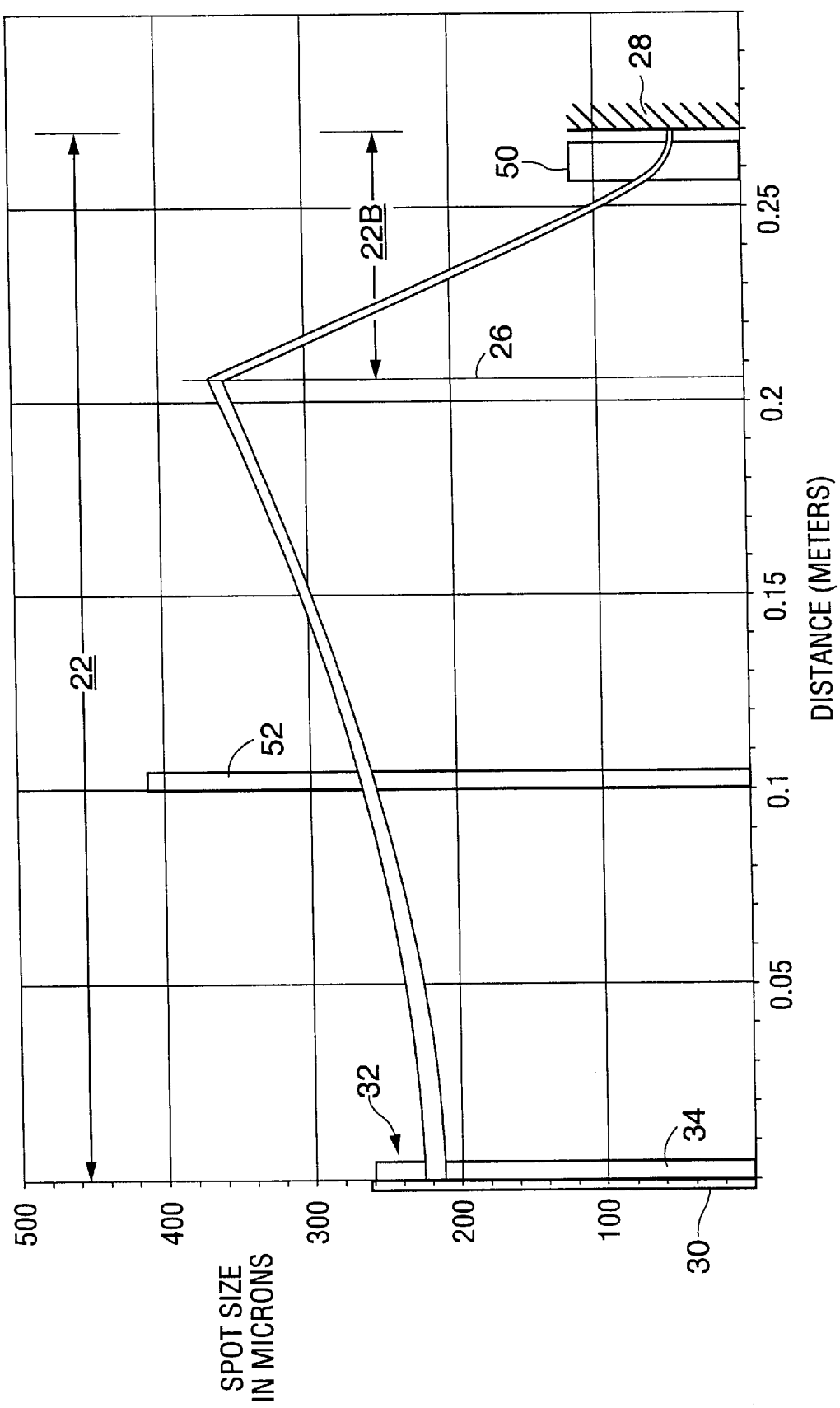
FIG. 3 is a graphical representation of the mode-size of fundamental radiation as function of axial position in one preferred embodiment of the resonator of FIG. 1.

FIG. 3 graphically illustrates spot size (spot radius or ray height) as a function of the axial position in the exemplary resonator wherein mirrors 26 and 28 are concave mirrors having a radii of curvature of 100 mm and 50 mm respectively. Mirrors 26 and 30 are axially separated by a distance of 202 mm. Mirrors 26 and 28 are axially separated by a distance of about 100 mm. Accordingly, resonator 22 has a total axial length of 302 mm, i.e., about 0.3 meters (m). It can be seen that the effect of concave mirrors 26 and 28 is to focus the beam to a radius of about 50 micrometers ($\mu$m) in optically-nonlinear crystal 50.

Figure 4A:
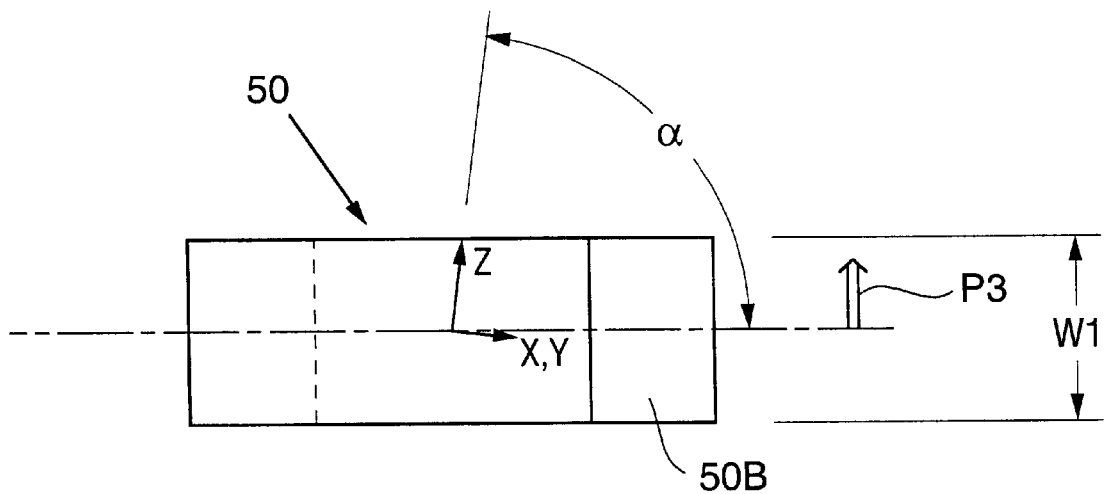
FIGS. 4A–D schematically illustrates details of CLBO crystals arranged for use as the optically-nonlinear crystal of FIG. 1.
Figure 4B:
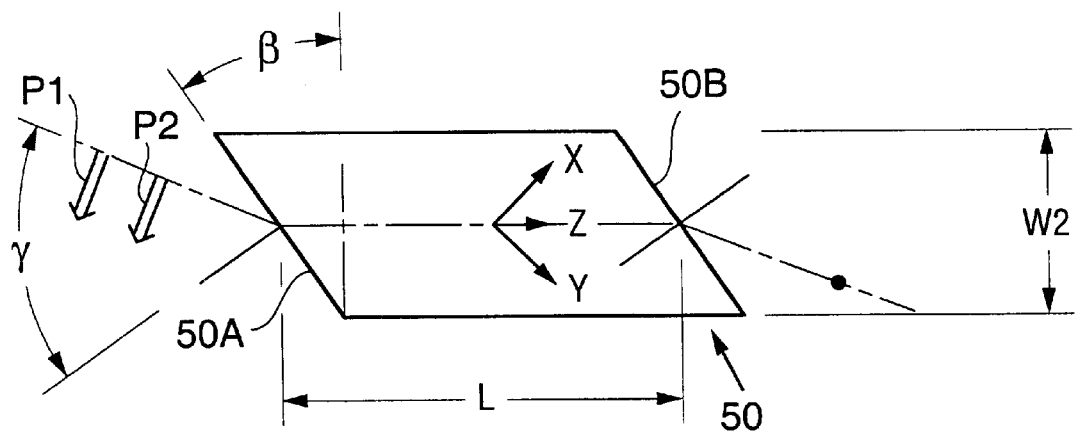

Referring now to FIGS. 4A and 4B, optically-nonlinear crystal 50 in this example, is a CLBO crystal having a length L of 10.0 mm and a cross-section (W1 and W2) of 3.5 mm×3.5 mm. The crystal is cut for type-1 mixing 976 nm radiation. Propagation of the fundamental beam is at 6.7° to the crystallographic X-Y plane. The crystallographic z-axis is at an angle $\alpha$ of 83.3° to the propagation direction. The fundamental-radiation F and injected ultraviolet radiation S are polarized parallel to the X-Y plane as illustrated by arrows P1 and P2. Sum-frequency radiation SF is polarized perpendicular to the X-Y plane, as illustrated by arrow P3.

Entrance and exit faces 50A and 50B, respectively, of optically-nonlinear-crystal 50 are polished at an angle $\beta$ of 39.9° from perpendicular to the direction of propagation in optically-nonlinear crystal 50. Fundamental radiation is incident on face 50A at an angle $\gamma$ of 56.1° which is Brewster's angle for the fundamental wavelength. In the resonator exemplified above with reference to FIG. 3, entrance face 50A of optically-nonlinear crystal 50 is axially spaced at about 55 mm from fold-mirror 26.

A disadvantage of the arrangement of optically nonlinear crystal 50 is that sum-frequency radiation SF suffers a reflection loss of about 15 percent at face 50B of optically-nonlinear crystal 50 as a result of the polarization orientation of the radiation relative to the orientation of face 50B. Fundamental radiation F which has its orientation parallel to the plane of incidence of face 50B and is incident at Brewster's angle thereto does not suffer any significant loss.

Figure 4C:
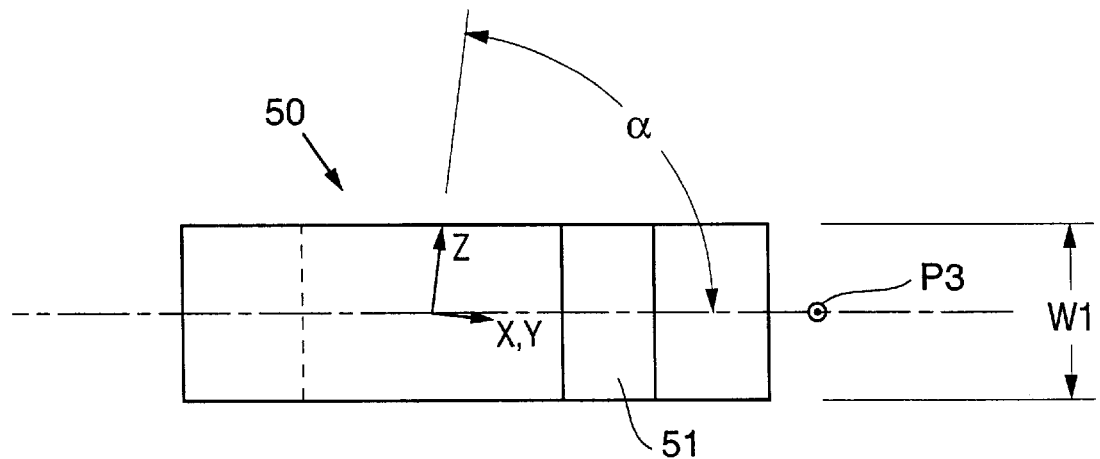
Figure 4D:
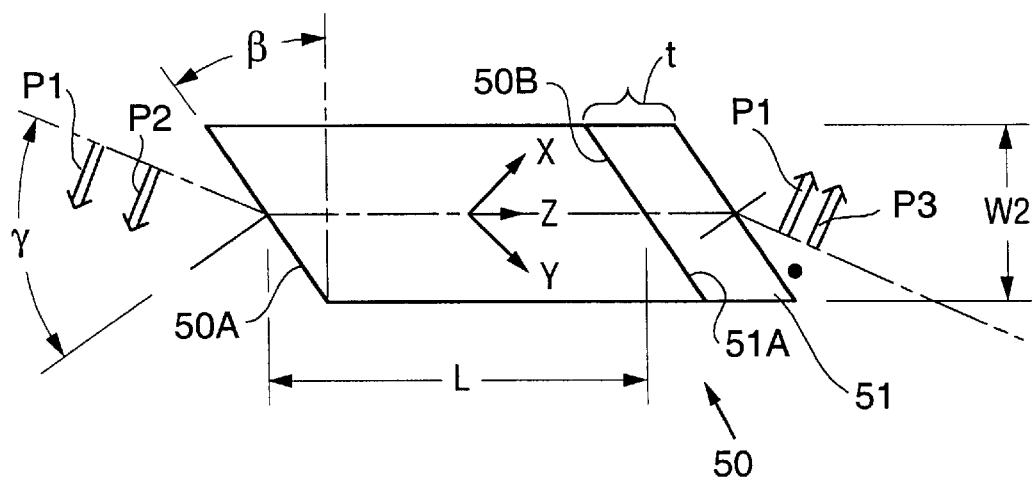

One arrangement for overcoming this disadvantage is depicted in FIGS. 4C and 4D. Here, a (birefringent) crystal-quartz element 51, having parallel entrance and exit faces 51A and 51B respectively, has entrance face 51A thereof optically joined to exit face 50B of optically-nonlinear crystal 50. The term optically joined, here means with faces 51A and 50B joined in a manner which effectively excludes air between the faces. The joint is preferably made by direct optical contact between the faces, but the use of an adhesive or index matching fluid is not precluded. Crystal-quartz has a refractive index which closely (within about 0.1) matches that of CLBO, thereby minimizing Fresnel reflection loss at the optical joint.

Element 51 has an length t, in the direction of propagation of radiations S and SF, selected such that while the polarization of fundamental radiation F is rotated as it traverses birefringent element 50 its polarization orientation at face 51B of birefringent element 51 is parallel to the plane of incidence of face 50B. Length t is selected such that, due to rotation in birefringent element 51, the polarization orientation (P3) of sum-frequency radiation SF at face 51B of birefringent element 51 is at ninety-degrees to its orientation on leaving face 50B of optically-nonlinear crystal 50. This places the polarization orientation of sum-frequency radiation SF at face 51B of birefringent element 51 parallel to the plane of incidence of face 51B thereby minimizing reflection losses at face 51B. By way of example, for a quartz crystal cut such that its optic axis is at 45° to the direction of propagation of radiations S and SF, a length t of about 6.1 mm will provide the desired polarization orientation for fundamental and sum-frequency radiations F and SF.

Those skilled in the art will recognize that the above-described differential polarization rotation for the fundamental and sum-frequency radiations may be accomplished by a birefringent element 51 formed from a birefringent material other than crystal-quartz. Preferably, however, the material should have a close refractive index match the optically nonlinear crystal to which it is optically contacted.

Figure 5:
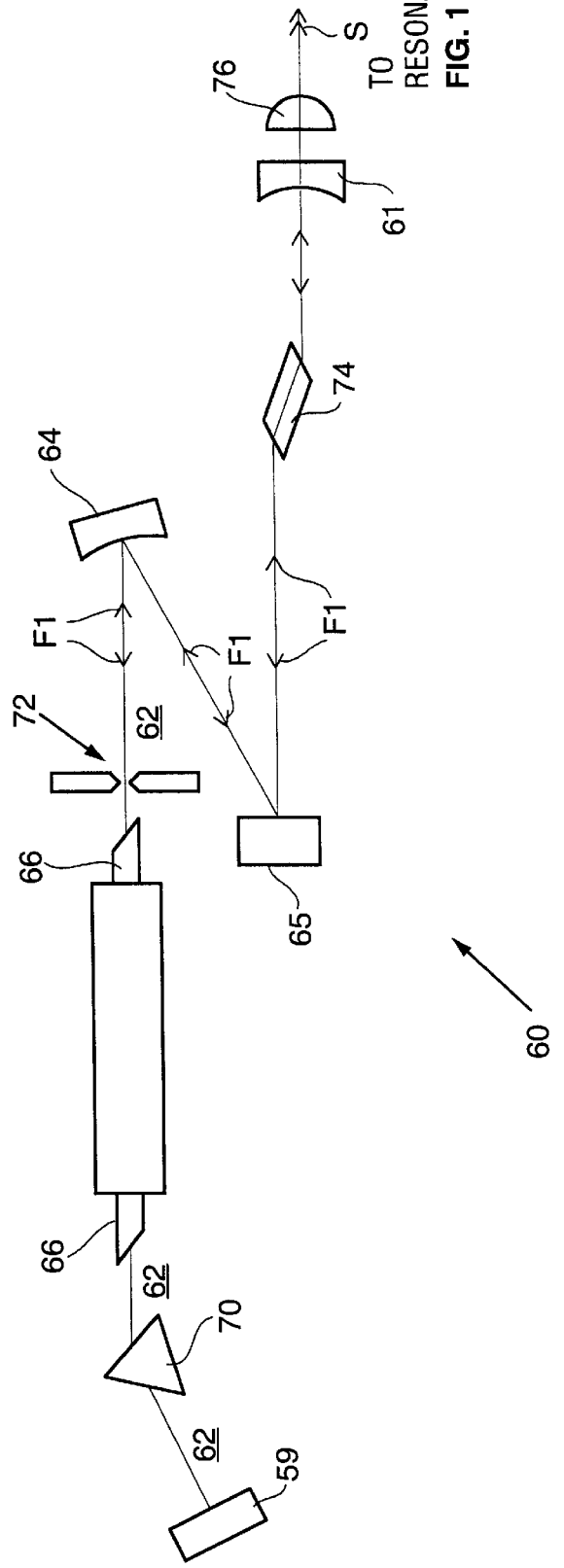
FIG. 5 schematically illustrates a prior-art intracavity frequency-doubled argon-ion laser suitable for the second laser-resonator of FIG. 1.

Referring now to FIG. 5, one preferred laser 60 for providing UV-radiation S of 244 nm is a FRED™ laser available from Coherent Laser Group of Santa Clara, Calif. Laser 60 is an intracavity frequency-doubled argon-ion laser having a resonator 62 terminated by end mirrors 59 and 61, folded by a fold mirrors 64 and 65, and including an argon plasma-tube 66. Details of pumping arrangements for plasma-tube 66 are omitted for simplicity of description. A prism 70 is included for selecting between the 514.5 nm and 488.0 nm fundamental argon-ion wavelengths illustrated collectively here by arrows F1. A spatial filter 72 is provided for mode selection. Mirrors 64 and 61 concentrate fundamental radiation F1 in a temperature controlled $\beta$-barium borate (BBO) crystal, arranged for frequency doubling the fundamental radiation thereby generating frequency-doubled radiation S. S has a wavelength of 244 nm when the 488 nm fundamental wavelength is selected by prism 70. A cylindrical lens 76 is provided for correcting ellipticity of the frequency-doubled beam produced by the BBO crystal.

The above-specified exemplary OPS-laser resonator 22 is capable of generating an intracavity fundamental (976 nm) radiation (F) power of 500 watts or greater for sum-frequency mixing. Numerical models indicate that mixing 1 Watt of 244 nm radiation with 500 W of 976 nm radiation in a CLBO crystal, cut and arranged in the resonator as defined above as described above, will yield sum-frequency radiation SF at a power of about 100 mW in single longitudinal (axial) mode and single transverse mode with a beam divergence of about 1.2 times the diffraction limit ($M^2$=1.2). The quantity $M^2$ is a numerical measure which represents a ratio of the divergence of the beam to the divergence of a diffraction-limited beam of the same size. A high quality beam may be regarded as a beam having an $M^2$ of about 2.0 or less. The high-beam quality available with the inventive laser system makes it useful for applications in which the laser output-radiation must be focused to a very small spot for high-resolution direct writing. The invention, however, is not limited to single mode operation, somewhat higher output power may be achieved in multimode operation at the expense of some reduction in beam quality.

Figure 6:
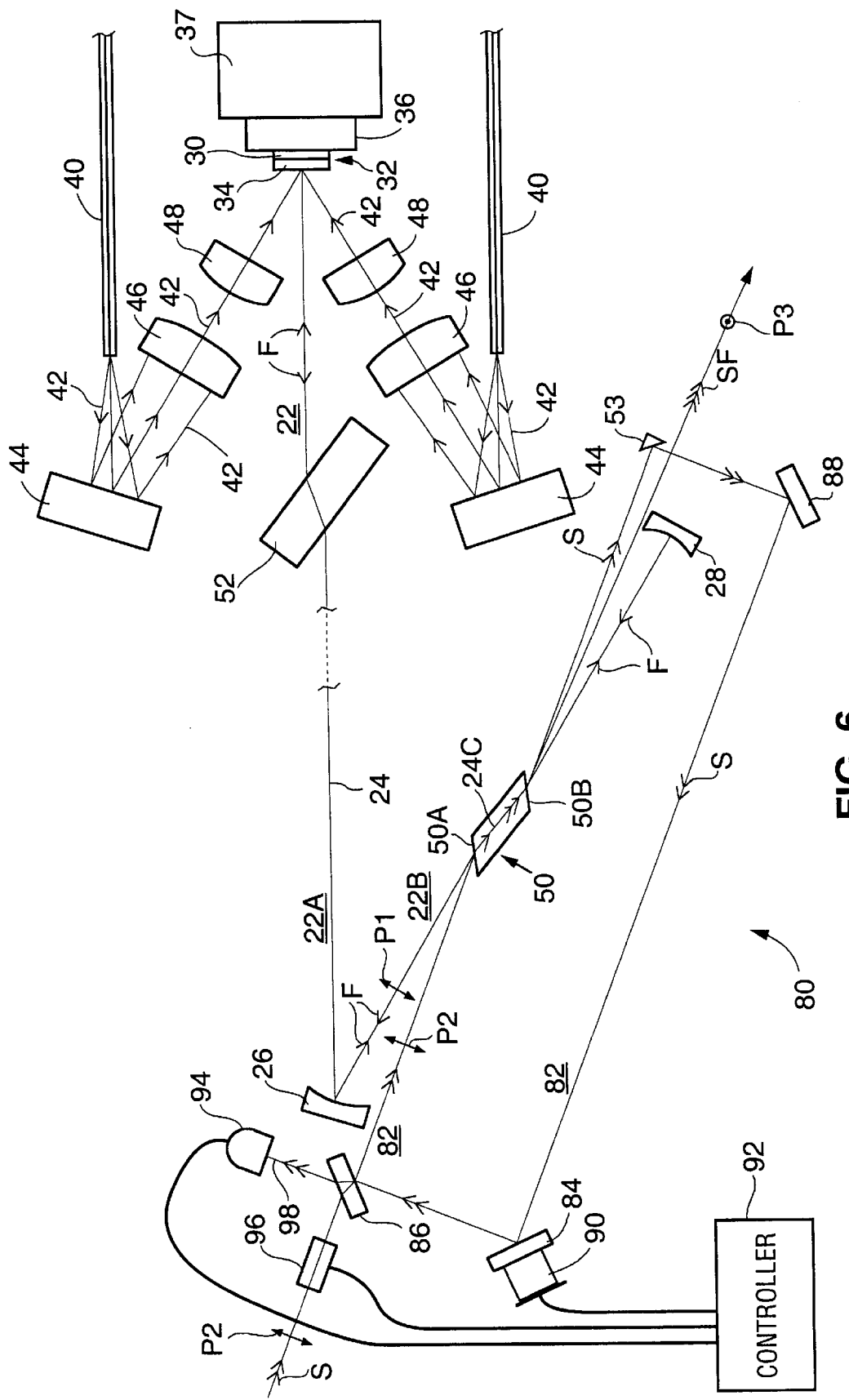
FIG. 6 schematically illustrates another preferred embodiment of a UV-laser system in accordance with the present invention similar to the laser system of FIG. 1 but further including an external ring-resonator for recirculating injected UV-radiation through the optically-nonlinear crystal.

Referring now to FIG. 6, another preferred embodiment 80 of a laser system in accordance with the present invention is illustrated. Laser system 80 includes resonator 22 of FIG. 1 including an optically-nonlinear crystal 50 arranged as described above. Laser 80 additionally includes a travelling-wave ring-resonator 82 formed by reflective stop 53 and mirrors 84, 86, and 88. Ring resonator 82 can be defined as a passive resonator inasmuch as it does not include a gain-medium for providing optical gain. Resonator 22 of FIG. 1 and resonator 62 of FIG. 5 can be defined as active resonators.

The purpose of ring-resonator 82 is to reinforce radiation S mixing with fundamental radiation F in optically-nonlinear crystal 50. Stop 53, and mirrors 84 and 86 are maximally reflective for radiation S. Mirror 86 is partially transmissive, for example, about 1% transmissive for radiation S. It is important in this embodiment of the present invention that radiation S is delivered from the external resonator in a single axial mode (single frequency).

Mirror 84 is driven by a piezoelectric driver 90 or the like to maintain ring-resonator 82 in a resonant condition for radiation S by actively adjusting the path length for radiation S in the ring-resonator. Operation of driver 90 is controlled by a electronic drive and control circuitry (controller) 92. A preferred control scheme for controlling piezoelectric driver 90 is a Pound-Drever locking scheme. This control scheme is described in detail in a paper "Laser Phase and Frequency Stabilization using an Optical Resonator", Applied Phys.B, Vol 31, pp97–105, 1983. A brief description of important elements of the control scheme is set forth below with continuing reference to FIG. 6.

A photodetector 94 is positioned to receive any radiation S reflected from mirror. When resonator 82 is in a resonant condition for radiation S, there is no radiation S reflected from mirror 86 along path 98. A phase-modulator 96 is positioned in the path of radiation S before it is injected into resonator 82 through mirror 86. The phase-modulator is arranged and operated at a predetermined frequency, for example, 20 megahertz (MHz), such that the spectrum of radiation leaving the phase-modulator includes a carrier component having the frequency of radiation S, and two side-band frequencies, one at a higher frequency and one at a lower frequency than the carrier-component frequency. The side-band frequencies have opposite phase.

When the carrier and side-band frequencies impinge on photodetector 94, the photodetector delivers a signal to controller 92. The signal delivered to controller 92 includes a 40 MHz component, created by beating of the side-band frequencies with each other, and two 20 MHz components having opposite phase, created by beating of the side-band frequencies with the carrier. Controller 92 is arranged to electronically filter the signal from photodetector 94 to remove the 40 MHz component therefrom. The sum of the remaining 20 MHz components provides an error signal for controlling driving of piezoelectric driver. The magnitude of the signal is representative of the difference in path-length for radiation S, in the resonator, from the path-length required for the resonant condition. The sign of the signal provides an indication of whether the path-length is too long or too short. The signal passes from negative to positive, steeply, through zero, which is the value of the signal when resonator 82 is in the resonant condition.

When optimally adjusted to resonance by piezoelectric driver 90, resonator 82 causes 1 W of radiation S injected therein via mirror 88 to build up in resonator 82 to about 8.0 Watts. This can increase the output-power of SF radiation to about 800 mW, given the above-discussed 500 W of circulating 976 nm radiation an 1 W of 244 nm radiation injected into resonator 82.

Figure 7:
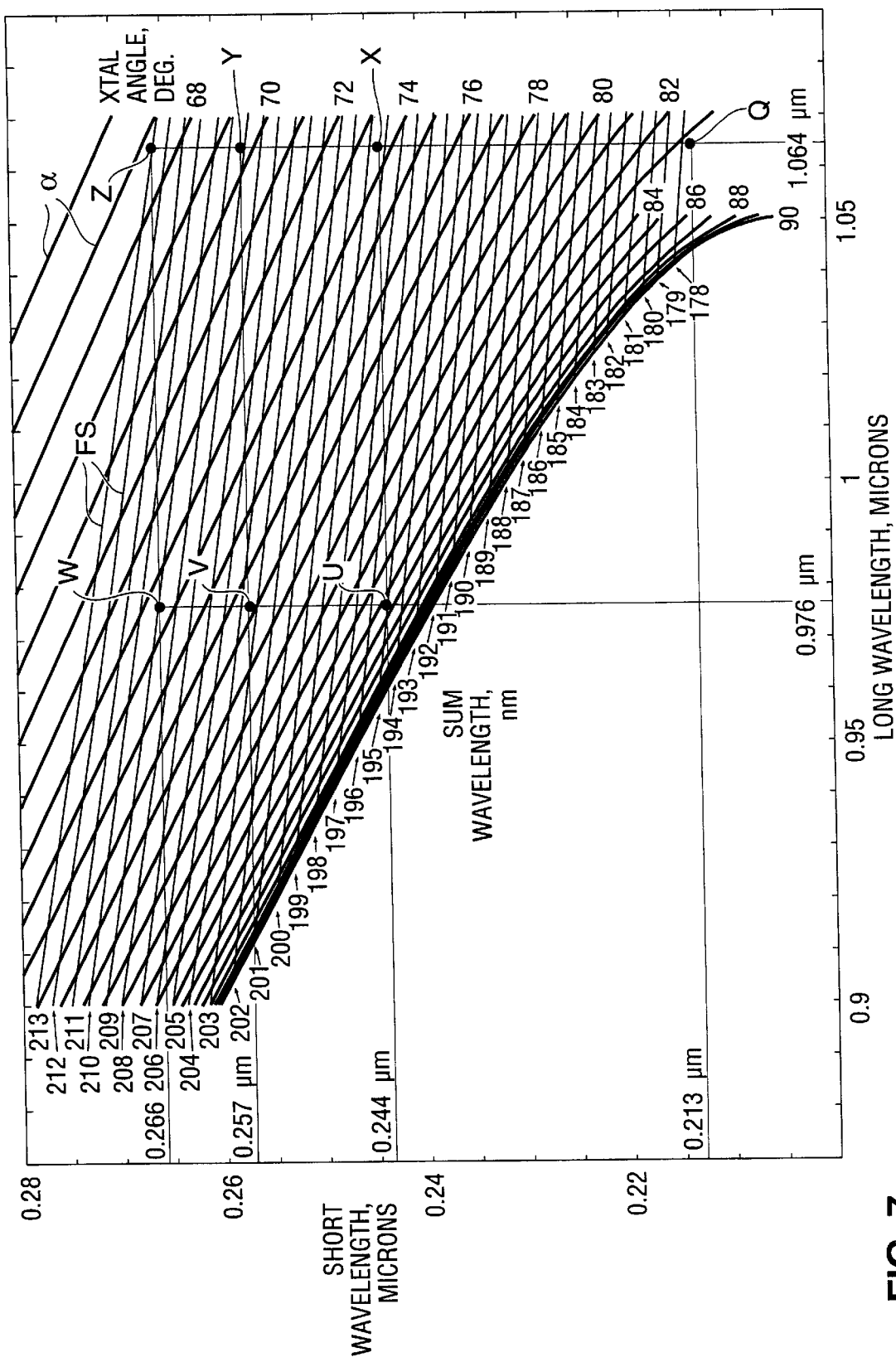
FIG. 7 is a nomogram schematically illustrating wavelength ranges of sum-frequency mixing and corresponding crystal angles in CLBO.

While laser systems in accordance with the present invention have been described with reference to generating 195 nm radiation by sum-frequency mixing 976 and 244 nm radiation, the inventive lasers are not limited to mixing those particular wavelengths or to mixing wavelengths which are harmonically related. By way of example, FIG. 7 illustrates a range of wavelengths F and S which may be mixed in a CLBO crystal in the above described laser systems to produce UV (SF) radiation in a wavelength range between about 175 nm and 215 nm. Radiation S may be derived not only from the frequency-doubled argon-ion laser exemplified above, but also from other laser types, such as as well known frequency-quadrupled or frequency-quintupled Nd:YAG lasers. Similarly, fundamental radiation F may be produced not only from an above exemplified fundamental OPS-laser-resonator but from a suitably configured resonator including a solid-state gain medium such as Nd:YAG or Nd:YVO$_4$.

In FIG. 7, shallow-sloped lines FS indicate the loci of sum-frequency wavelengths on a Cartesian coordinate system with radiation S as the ordinate and radiation F as the abscissa. Steeper sloped lines α are the loci of crystal-cut angles (α in FIG. 4A) for combinations of S, F and SF radiations. By way of example, point U at F=976 and S=244 lies on the 195 nm FS locus and between the 82° and 84° α loci, corresponding to the example described above. It can also be seen that 195 nm radiation can be provided by combinations of radiation S at a wavelength between about 239 nm and 245 nm with fundamental radiation F between 959 and 1070 nm at a corresponding crystal-cut angle between 74° and 90°.

Points V and W provide 203 and 208 nm radiation by mixing wavelengths S of respectively 257 nm (the second harmonic of argon 514.5 nm) and 266 (the fourth harmonic of Nd:YAG 1064 nm) with the 976 nm radiation of the above-described OPS-laser-resonator 22. Points X, Y and Z illustrate the sum-frequency wavelengths and corresponding crystal-cut angles for mixing fundamental 1064 nm Nd:YAG radiation with respectively the 244 nm, 257 nm and 266 nm wavelengths. Point Q indicates that 178 nm radiation can be generated by mixing the fifth harmonic of 1064 nm Nd:YAG (213 nm) with the fundamental 1064 nm radiation at a crystal-cut angle of about 85 degrees.

Figure 8:
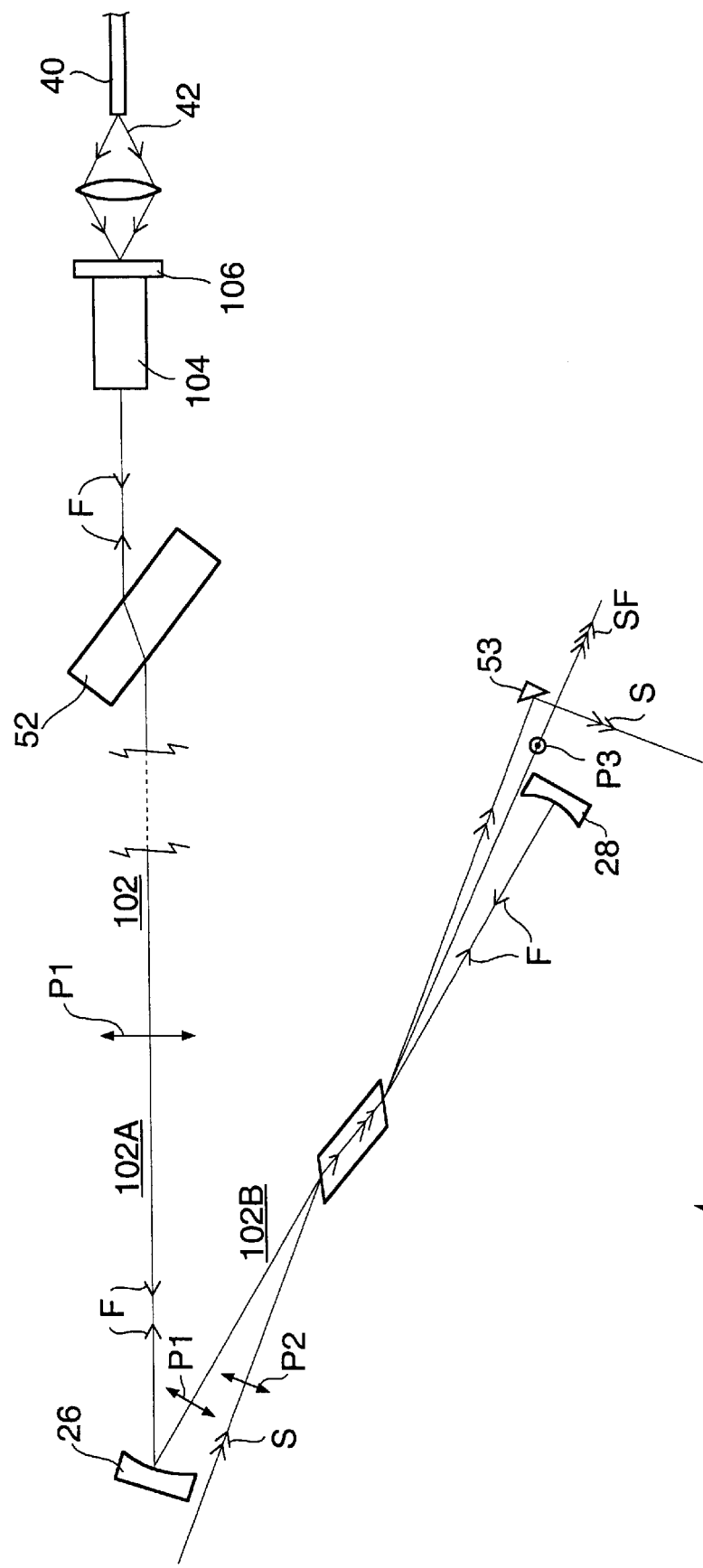
FIG. 8 schematically illustrates yet another preferred embodiment of a UV-laser system in accordance with the present invention having a first laser-resonator including solid-state gain medium and an optically-nonlinear crystal arranged for intracavity frequency-mixing the fundamental-wavelength of a solid-state gain-medium with UV-radiation injected into the first laser-resonator from a second laser-resonator, and wherein the first laser resonator is a standing-wave laser resonator.

While embodiments of UV-laser systems in accordance with the present invention have been described with reference to using at OPS-laser for generating the longer wavelength radiation, this should not be construed as limiting the present invention. As discussed above with reference to FIG. 7, fundamental radiation may be generated in other laser types, for example, diode-pumped solid-state (DPSS) lasers. By way of example, in FIG. 8, an embodiment 100 of a laser system in accordance with the present invention is illustrated, wherein a DPSS-laser resonator 102 provides long-wavelength fundamental radiation. Laser 100 is similar in most regards to laser 20 of FIG. 1 with the exception of the fundamental resonator.

Resonator 102 includes a solid-state gain-medium 104. Gain-medium 104 is preferably Nd:YAG or Nd:YVO$_4$. The preference of these gain-media, however, should not be construed as limiting the present invention. One end-mirror 106 of resonator 102 is located very close to gain-medium 104, and may even be provided by an optical-coating deposited directly on a face of the gain-medium. However provided, mirror 106 is highly reflective for the lasing wavelength of the gain-medium and highly transmissive for the wavelength of pump-light 42. Pump-light 42 is delivered by an optical fiber 40 and focused by a lens 41, through mirror 106, into gain-medium 104.

In one example of laser 100, mirror 26 has a radius of curvature of 188 mm and is located 537 mm from mirror 106. Mirror 28 has a radius of curvature of 90 mm and is located 215 mm from mirror 26. Optically-nonlinear crystal 50 is located with face 50A thereof at a distance of 115 mm from mirror 26. Gain-medium 104 is a Nd:YVO$_4$ crystal having a length of 7.0 mm and a cross-section of 4.0 mm×4.0 mm. Pumping gain-medium with 20 W of 809 nm radiation can provide 200 W of 1064 nm radiation circulating in resonator 102. While an Nd:YAG or Nd:YVO$_4$ DPSS-laser resonator such as resonator 102 of laser 100 can generate circulating fundamental-radiation power comparable to that generated by resonator 22 of FIG. 1, it is effectively limited (in the context of providing useful power) to generating a few discrete fundamental wavelengths at wavelengths of about 1052 nm or longer.

In all of the above described embodiments of laser systems in accordance with the present invention, fundamental radiation F is generated in a standing-wave resonator in which radiation circulates in two opposing axial directions in the resonator. While such a resonator is relatively simple to design and align, for sum frequency mixing in accordance with the present invention it is not the most efficient. This is because only that fundamental radiation F travelling in the same direction as radiation S injected into the resonator mixes to form radiation SF. Radiation travelling in the opposite direction contributes to heating of the crystal without contributing to the sum-frequency generating process. This inefficiency can be avoided by generating fundamental radiation F in a ring-resonator (travelling-wave) resonator in which laser radiation circulates in one direction only. A description of preferred embodiments of laser systems in accordance with the present invention including a such travelling-wave resonator for generating is set forth below, again with reference to generating UV-radiation having a wavelength between about 175 and 215 nm.

Figure 9:
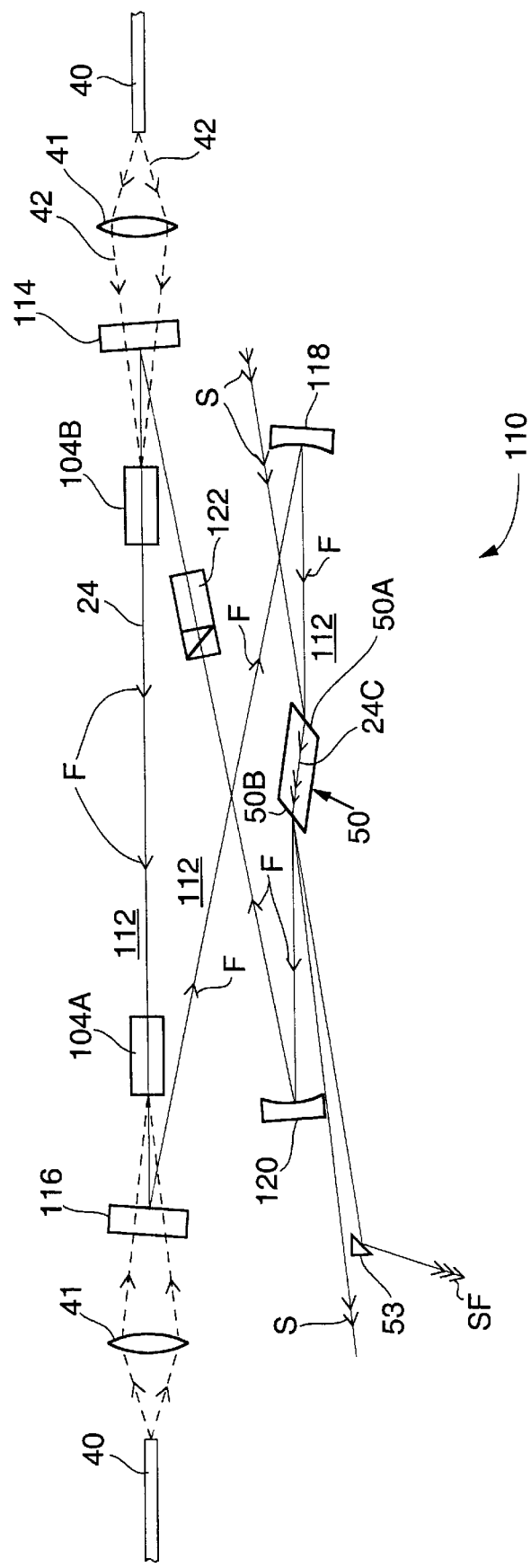
FIG. 9 schematically illustrates still another preferred embodiment of a UV-laser system in accordance with the present invention, similar to the laser system of FIG. 8, but wherein the first laser resonator is a travelling-wave ring-resonator.

Referring to FIG. 9 a laser system 110 in accordance with the present invention includes a ring-resonator 112 formed by mirrors 114, 116, 118, and 120, and having a resonator axis 24. Resonator 112 includes two rods 104A and 104B of a solid-state gain-medium, located between mirrors 114 and 116 and proximate mirrors 116 and 114 respectively. These rods are preferably of Nd:YAG or Nd:YVO$_4$ as discussed above. Rods 104A and 104B are each optically-pumped by light 42 from a diode-laser array (not shown) delivered by an optical fiber 40 as discussed above with reference to laser 100 of FIG. 8. An optical diode 122 provides that fundamental radiation generated in resonator 112 as a result of the optical pumping circulates only in one direction as indicated by arrows F. It should be noted here that provision of two rods of gain-medium in resonator 112 is chosen, inter alia, to optimize delivery of pump light to each rod through mirrors 114 and 116. Further, providing two rods rather than one rod provides that the same circulating fundamental-radiation power can be provided with less thermal loading of a gain-medium rod.

Mirrors 120 and 118 are concave mirrors and are configured such that circulating radiation F is focussed to a narrow waist between the mirrors. An optically-nonlinear crystal 50 is located between mirrors 120 and 118 and is arranged as discussed above for mixing fundamental radiation F with UV-radiation S injected into resonator 112. Here again, this is preferably 244 nm radiation provided by an intracavity frequency-doubled, argon-ion laser. Optically-nonlinear crystal 50 is configured and then injection direction of UV-radiation S is selected such that UV-radiation S and fundamental radiation F travel together generally along path 24C in optically nonlinear crystal 50 where they mix to form UV-radiation SF (triple arrows) having a shorter wavelength than UV radiation S having the sum-frequency of radiations F and S1. Where radiation F has a wavelength of about 1064 nm characteristic of Nd:YAG or Nd:YVO$_4$ and S has a wavelength of 244 nm characteristic of a frequency-doubled argon ion laser, radiation S will have a wavelength of about 198 nm.

As discussed above, UV-radiation S and shorter wavelength UV-radiation SF exit optically-nonlinear crystal 50 at an angle to fundamental radiation F and at an angle to each other. UV-radiations S and SF are spatially further separated by a reflective stop 53 as discussed above with reference to other embodiments of the present invention. UV-radiation S enters and leaves resonator 112 and UV-radiation SF leaves resonator 112 without passing through any optical components of the resonator.

Figure 10:
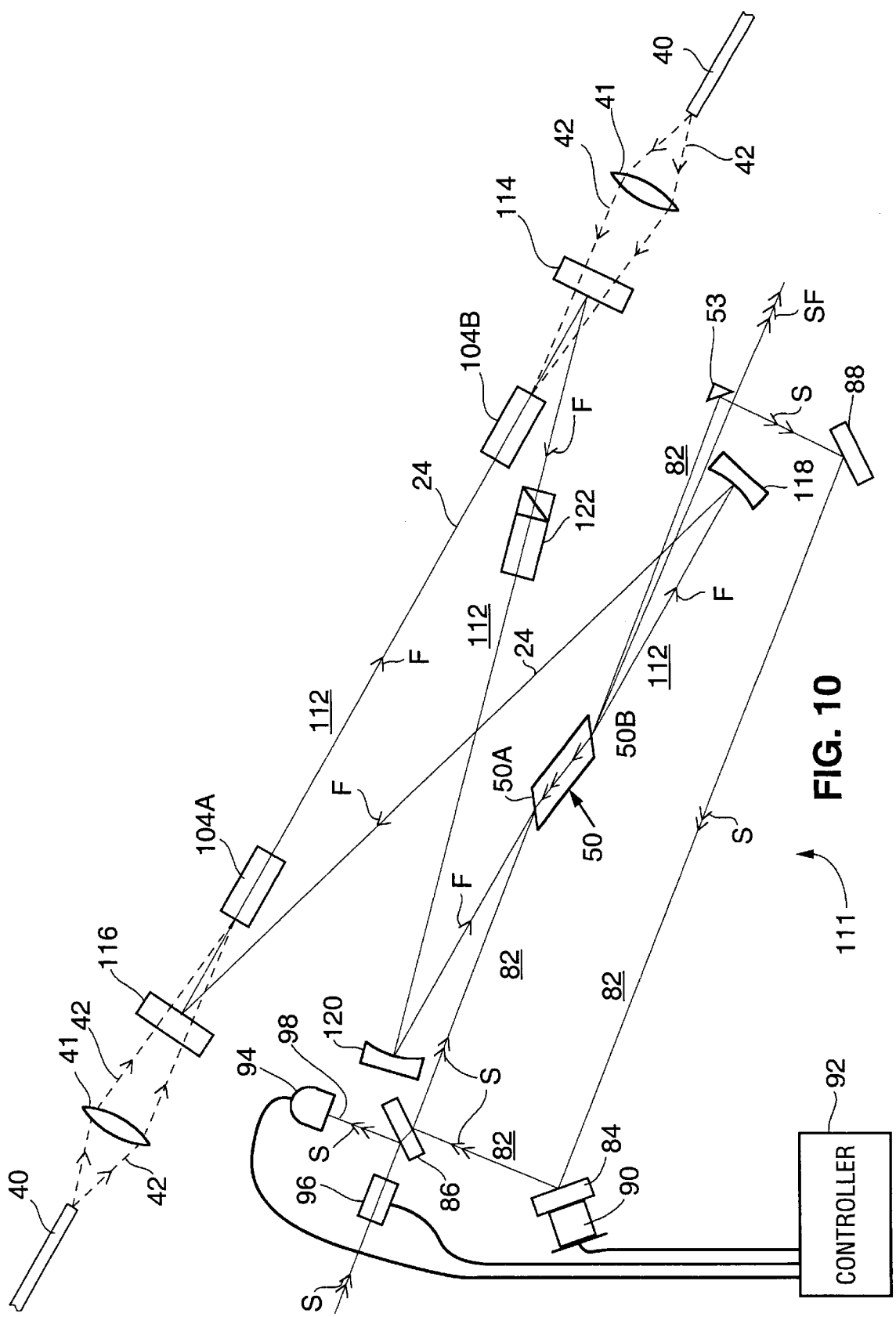
FIG. 10 schematically illustrates still yet another preferred embodiment of a UV-laser system in accordance with the present invention similar to the laser system of FIG. 9 but further including an external ring-resonator for recirculating injected UV-radiation through the optically-nonlinear crystal.

A separate passive ring-resonator arrangement for circulating UV-radiation S through optically-nonlinear crystal may be used for recirculating UV-radiation S through optically-nonlinear crystal 50 as described above with reference to laser system 80 of FIG. 6. In FIG. 10 a laser system 111 is depicted which includes such a passive ring resonator. Laser 111 includes an active ring-resonator 112, as described above with reference to laser system 110, for generation fundamental radiation and circulating the fundamental radiation through an optically nonlinear crystal 50. Laser system 11 also includes a passive ring-resonator 82 formed by reflective stop 53 and mirrors 88, 84, and 86 as described above with reference to FIG. 6 including a control arrangement (controller 92 and components associated therewith) for varying the length of resonator 82 to optimize reinforcement of circulating UV-radiation S.

Figure 11:
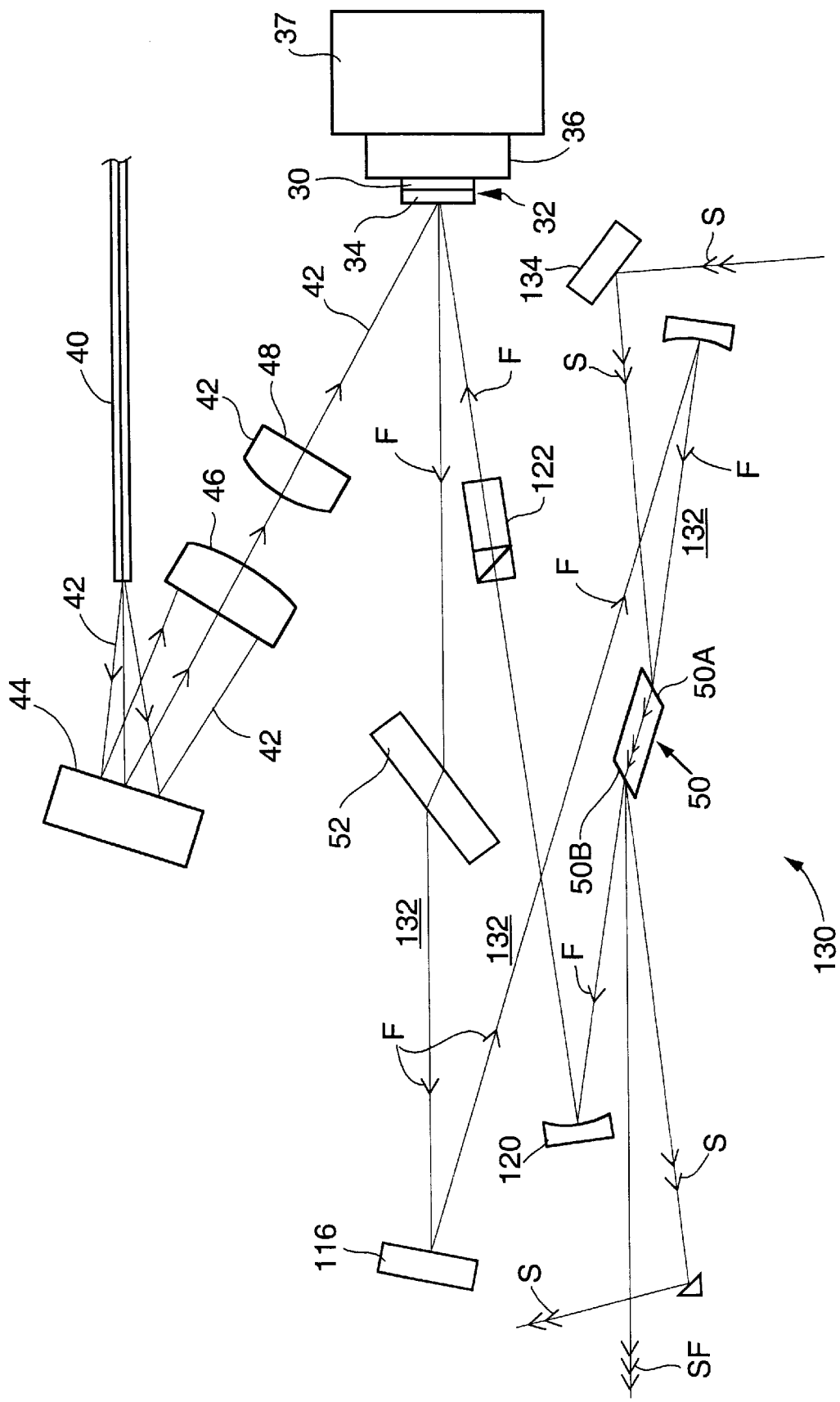
FIG. 11 schematically illustrates a further preferred embodiment of a UV-laser system in accordance with the present invention, similar to the laser system of FIG. 1, but wherein the first laser resonator is a travelling-wave ring-resonator.

The above-described active ring-resonator arrangement for circulating fundamental-radiation F in one direction may also be applied in a laser system in accordance with the present invention wherein the fundamental radiation is provided by an OPS-laser. One such embodiment 130 of the inventive laser system is depicted in FIG. 11. Here, a ring-resonator 132 is formed by mirror-structure 30 of an OPS-structure 32, together with mirrors 116, 118 and 120. Gain structure 34 of OPS-structure 32 is located within resonator 132. Gain-structure 32 is optically pumped by pump light 42 focussed by lenses 46 and 48 as described above with reference to FIG. 1. An optically nonlinear crystal 50 is provided for mixing fundamental-radiation F with injected UV-radiation S to provide shorter wavelength UV-radiation SF as described above. UV radiation S is directed into optically nonlinear crystal 50 by a turning mirror 134. A birefringent filter 52 is provided in resonator 132 for maintaining fundamental-radiation F at the wavelength for which optically nonlinear crystal 50 is configured.

Figure 12:
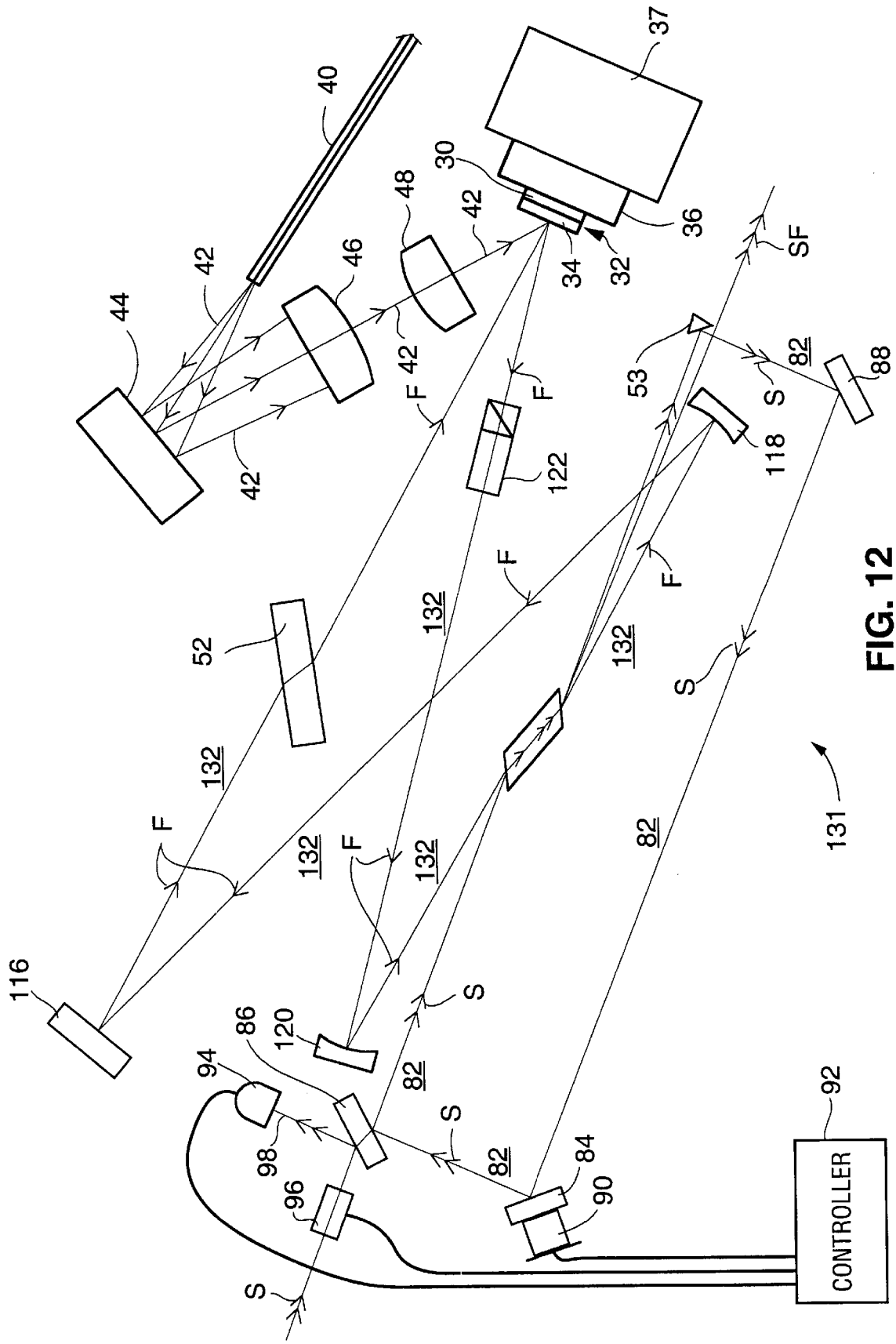
FIG. 12 schematically illustrates another preferred embodiment of a UV-laser system in accordance with the present invention similar to the laser system of FIG. 11 but further including an external ring-resonator for recirculating injected UV-radiation through the optically-nonlinear crystal.

Apart from the substitution of an OPS gain-structure for a solid-state gain-medium, laser system 130 functions in the same manner as laser system 110 of FIG. 9. A passive ring-resonator may be provided for recirculating UV-radiation S through optically-nonlinear crystal 50. One such arrangement 131 of the inventive laser system is depicted in FIG. 12 and includes a passive ring-resonator 82 as described above with reference to FIG. 10.

Figure 2:
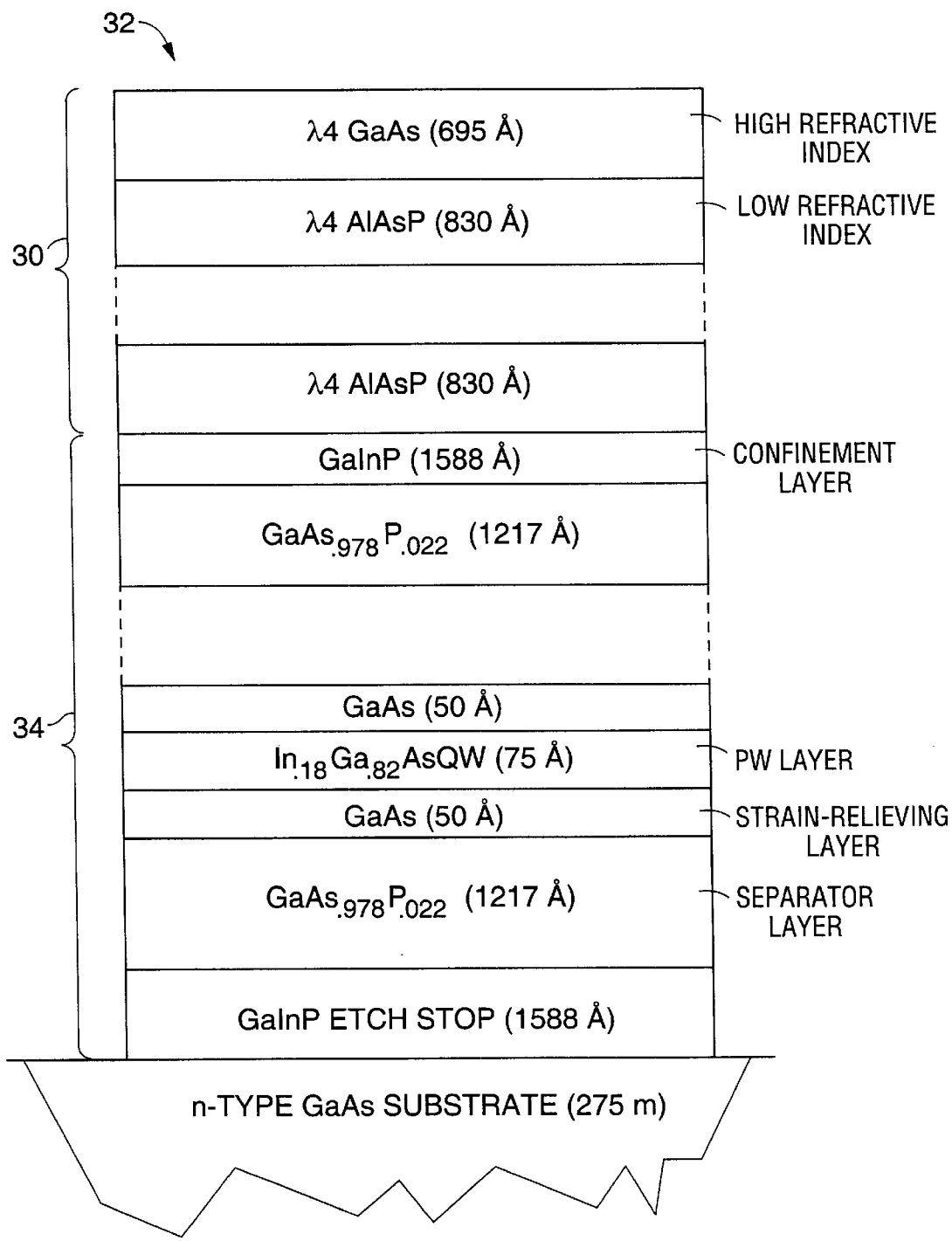
FIG. 2 schematically illustrates details of one preferred example of the OPS-structure of FIG. 1 for providing fundamental radiation at about 976 nm.

One advantage, of using an OPS-laser for generating fundamental radiation in a laser system in accordance with the present invention is that a gain-structure of an OPS structure may be arranged (by appropriate selection of active layer composition) to provide fundamental radiation at a wide range of wavelengths within the preferred range of about 900 to 1080 nm corresponding to the CLBO arrangements of FIG. 7. The OPS-structure of FIG. 2 is one example of such a gain-structure and is an example of a general structure grown on a GaAs substrate and having active layers of a general composition $In_xGa_{1-x}As$ and separator layers of a general composition $GaAs_yP_{1-y}$, where $0.0<x<1.0$, and $0.0<y<1.0$. In this general structure, x may be selected to provide emission at essentially any wavelength between about 900 and 1050 nm, and y is selected to optimally absorb pump-light of an appropriate wavelength.

In summary, each embodiment of the present invention includes a first laser resonator which generates fundamental laser-radiation at a first wavelength the first resonator includes an optically-nonlinear crystal. Radiation (coherent-radiation) delivered from a second laser resonator is mixed in the optically-nonlinear crystal with the fundamental radiation circulating in the first resonator thereby generating radiation having the sum frequency of the first and second wavelengths. The first and second laser resonators are separate resonators not having any common optical components. This provides that each resonator can be optimally configured for the particular gain-medium used in the resonator and for desired operating parameters of the resonator.

A laser system in accordance with the present invention is particularly effective if the first laser resonator is a ring-resonator in which the fundamental-radiation is caused to circulate in one direction only. In a standing-wave resonator, fundamental-radiation circulates in opposite directions, but only that fundamental-radiation travelling in the same direction as the radiation injected from the second resonator mixes with the injected radiation to provide the desired output radiation.

The inventive laser system is particularly advantageous for generating deep UV-radiation by mixing coherent near UV-radiation with near infra-red (NIR) laser-radiation generated in a resonator including a solid-state gain medium or a semiconductor gain-structure. Using separate resonators and the inherent difference in refraction of the optically-nonlinear crystal for NIR and UV radiation makes it possible to inject near UV-into the optically nonlinear crystal and receive deep-UV radiation from the optically-nonlinear crystal without any UV-radiation passing through any optical element of the first laser resonator. This avoids loss of UV radiation in refractive optical elements.

The present invention is described above in terms of a preferred and other embodiments. The present invention is not limited, however, to the embodiments described and depicted. Rather, the present invention is limited only by the claims appended hereto.

What is claimed is:

1. A laser system comprising:
   a laser resonator including at least two mirrors and a nonlinear crystal therebetween for generating laser radiation at a first wavelength, said first wavelength radiation being circulated in only one direction the resonator; and
   a source of laser radiation of a second wavelength, said radiation being directed to enter the nonlinear crystal of the laser resonator in a manner such that second wavelength laser radiation interacts with the first wavelength laser radiation within the crystal to generate laser radiation of a third wavelength corresponding to the sum frequency of the first and second wavelengths, with the laser radiation of said third wavelength exiting the laser resonator without passing through any of said resonator mirrors.

2. The laser system of claim 1, wherein the laser radiation of said third wavelength exits the nonlinear crystal without passing through any of said resonator mirrors.

3. The laser system of claim 2, wherein the laser radiation of said second wavelength enters the nonlinear crystal without passing through any of said resonator mirrors.

4. The laser system of claim 1, wherein said nonlinear crystal is arranged such that said second-wavelength radiation enters said nonlinear crystal at an angle to said first-wavelength radiation and follows a common path with said first wavelength radiation through said nonlinear crystal, and first wavelength radiation and third-wavelength radiation exiting said nonlinear crystal at an angle to said second wavelength radiation.

5. The laser system of claim 1, wherein said first wavelength radiation is between about 200 and 280 nanometers, said second wavelength radiation is between about 900 and 1080 nm, and said third wavelength radiation is between about 175 and 215 nm.

6. The laser system of claim 1, wherein said nonlinear crystal is a crystal of an optically nonlinear material selected from the group consisting of CLBO, SBBO, SBO, BZBO, and BBO.

7. The laser system of claim 1, wherein said nonlinear crystal is a CLBO crystal.

8. The laser system of claim 1, further including a passive ring-resonator arranged circulating said second wavelength radiation through said nonlinear crystal.

9. A laser, comprising:
   an OPS-structure including a mirror structure in thermal contact with a heat-sink and surmounted by a multi-layer semiconductor gain-structure;
   a traveling-wave laser-resonator formed by a plurality of at least two mirrors and said mirror structure of said OPS structure, such that said gain-structure of said OPS-structure is located in said traveling-wave laser-resonator;
   a source of optical pump-light arranged to energize said gain-structure of said OPS structure for causing radiation having a first frequency to circulate in said traveling-wave laser-resonator; and
   an optically-nonlinear crystal located in said traveling-wave laser-resonator and arranged to convert said fundamental frequency radiation into radiation having a second frequency different from said first frequency.

10. The laser of claim 9, wherein said optically-nonlinear crystal converts said first-frequency radiation to said second-frequency radiation by mixing said first-frequency radiation with radiation having a third frequency.

11. The laser of claim 9, wherein said traveling-wave laser resonator is arranged such that said first-frequency radiation circulates in only one direction therein.

12. The laser of claim 9, wherein two mirrors are concave mirrors and are arranged face-to-face such that said circulating first-frequency radiation is focused to a narrow waist therebetween.

13. The laser of claim 9, wherein two mirrors are concave mirrors and are arranged face-to-face such that said circulating first-frequency radiation is focused to a narrow waist at a location therebetween, said optically nonlinear crystal being located at said narrow-waist location.

14. A laser, comprising:
   an OPS-structure including a mirror structure in thermal contact with a heat-sink and surmounted by a multi-layer semiconductor gain-structure;
   a traveling-wave laser-resonator formed by a plurality of at least two mirrors and said mirror structure of said OPS structure, such that said gain-structure of said OPS-structure is located in said traveling-wave laser-resonator;

a source of optical pump-light arranged to energize said gain-structure of said OPS structure for causing radiation having a first frequency to circulate in said traveling-wave laser-resonator;

said two mirrors being concave mirrors arranged face—face such that said circulating first-frequency radiation is formed into a narrow waist at a location therebetween; and an optically-nonlinear crystal located in said traveling-wave laser-resonator at said narrow-waist location and arranged to convert said fundamental frequency radiation into radiation having a second frequency different from said first frequency.

15. The laser of claim 14, wherein said optically-nonlinear crystal converts said first-frequency radiation to said second-frequency radiation by mixing said first-frequency radiation with radiation having a third frequency.

16. The laser of claim 14, wherein said traveling-wave laser resonator is arranged such that said first-frequency radiation circulates in only one direction therein.

* * * * *